(12) United States Patent
Yu

(10) Patent No.: US 6,214,681 B1
(45) Date of Patent: Apr. 10, 2001

(54) PROCESS FOR FORMING POLYSILICON/ GERMANIUM THIN FILMS WITHOUT GERMANIUM OUTGASSING

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/491,843

(22) Filed: Jan. 26, 2000

(51) Int. Cl.[7] ................................................. H01L 21/336
(52) U.S. Cl. .......................... 438/300; 438/592; 257/407; 148/DIG. 58
(58) Field of Search ...................................... 438/300, 592; 257/407; 148/DIG. 58

Primary Examiner—Long Pham
(74) Attorney, Agent, or Firm—Foley & Lardner

(57) ABSTRACT

An ultra-large scale integrated (ULSI) circuit includes MOSFETs which have different threshold voltages and yet have the same channel characteristics. The MOSFETs utilize gate structures with heavily doped polysilicon and germanium material. The polysilicon and germanium materials or thin films are manufactured by low pressure chemical vapor deposition. A silicon buffer layer and oxide cap is used to prevent germanium outgassing.

20 Claims, 15 Drawing Sheets

PROCESS FOR FORMING POLYSILICON/ GERMANIUM THIN FILMS WITHOUT GERMANIUM OUTGASSING

CROSS REFERENCE TO RELATED APPLICATIONS

This application is related to U.S. patent application Ser. No. 09/187,811, filed on Nov. 6, 1998, by Yu et al. Entitled "Heavily-Doped Polysilicon/Germanium Thin Formed by Laser Annealing," assigned to the Assignee of the present application.

FIELD OF THE INVENTION

The present invention relates generally to an integrated circuit (IC) and the fabrication of an integrated circuit. More particularly, the present invention relates to an integrated circuit having polysilicon and germanium gate stacks or polysilicon and germanium thin films.

BACKGROUND OF THE INVENTION

Ultra-large scale integrated (ULSI) circuits generally include a multitude of transistors, such as, more than one million transistors and even several million transistors on a substrate. The transistors are generally metal oxide semiconductor field effect transistors (MOSFETs) which include a gate conductor disposed between a source region and a drain region. The transistors can be N-channel MOSFETs or P-channel MOSFETs. The gate conductor is provided over a thin gate oxide material.

Polysilicon and germanium material and amorphous silicon and germanium material can be used in a myriad of potential semiconductor fabrication applications. For example, the gate conductor or electrode can be a polysilicon/germanium ($Si_xGe_{(1-x)}$) material that controls charge carriers in a channel region between the drain and the source to turn the transistor on and off. Polysilicon/ germanium gate materials are heavily doped (e.g., P+ or N+) to increase their conductivity.

A polysilicon/germanium gate conductor offers several advantages over conventional gate conductors. First, polysilicon/germanium gate conductors require a relatively low temperature rapid thermal anneal (RTA) to activate dopants (e.g., Boron (B), Phosphorous (P), etc.) in the gate conductor. A low temperature RTA facilitates the formation of ultra-shallow source/drain junctions and the formation of ultra-tight pocket regions. Second, polysilicon/germanium gate conductors effectively suppress boron penetration into a gate conductor heavily doped with phosphorous (P+). Third, polysilicon/germanium gate conductors can be utilized to adjust the threshold voltage of the transistor. The work function of a transistor is related to the concentration of germanium in the polysilicon/germanium gate conductor. This aspect is particularly advantageous in integrated circuits having transistors with several threshold voltage levels.

Germanium in the polysilicon/germanium material or amorphous silicon/germanium material can easily diffuse to the top surface of the gate conductor (stack). Germanium at the top surface can become oxidized at room temperature. Germanium diffusion to the top surface (germanium migration) is a particular problem at high concentrations (e.g., 10–50%, atomic percentage of germanium). Oxidized germanium (germanium dioxide ($GeO_2$)) is easily dissolved in water and can become permanently removed from the gate structure. The loss of germanium from the gate conductor is referred to as "germanium outgassing."

In conventional semiconductor fabrication processes, germanium outgassing can occur in at least two different situations. First, germanium outgassing can occur immediately after the polysilicon/germanium material or amorphous silicon/germanium material is provided by chemical vapor deposition (CVD). The polysilicon/germanium material or amorphous silicon/germanium material is often deposited as a thin film. The germanium exits a top surface of the thin film after deposition.

Second, germanium outgassing can occur after the gate conductor is patterned (the thin film is etched to form lines) and before conventional silicon dioxide ($SiO_2$) or silicon nitride ($Si_3N_4$) spacers are formed. Wherever germanium outgassing occurs, it can negatively impact the formation of polysilicon/germanium or amorphous silicon/germanium thin films.

Thus, there is a need for a process which can manufacture a polysilicon/germanium or amorphous silicon/germanium thin films without significant germanium outgassing. Further still, there is a need for a polysilicon/germanium gate conductor or stack which can be formed with minimal germanium outgassing. Even further still, there is a need for a polysilicon/germanium or amorphous silicon/germanium thin film that can be efficiently manufactured.

SUMMARY OF THE INVENTION

An exemplary embodiment is related to a method of manufacturing an integrated circuit. The method includes providing a semiconductor and germanium thin film above the top surface of a substrate utilizing a semiconductor source and a germanium source, and reducing the germanium source while providing the semiconductor and germanium thin film to form a semiconductor buffer layer above the semiconductor and germanium thin film. The method also includes oxidizing at least a portion of the buffer layer and providing nitride spacers on side walls of the thin film.

Another exemplary embodiment relates to a method of manufacturing a silicon and germanium thin film. The method includes steps of: depositing a germanium and silicon material utilizing a silicon source and a germanium source, turning the germanium source off to form a silicon buffer layer over germanium and silicon material, and heating the silicon buffer layer to form an oxide layer above the silicon buffer layer.

Yet another exemplary embodiment relates to a method of providing a polysilicon and germanium thin film for a integrated circuit. The method includes providing a silicon and germanium layer above a substrate, and providing a silicon buffer layer above the silicon and germanium layer. The method also includes oxidizing the silicon layer to form a silicon oxide layer above the silicon buffer layer.

Still another embodiment relates to a transistor including a source, a drain, and a gate stack. The gate stack is disposed between the source and the drain. The gate stack includes a doped polysilicon/germanium material, a silicon buffer layer above the doped polysilicon/germanium layer, and a nitride spacer abutting lateral sides of the polysilicon/germanium material.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
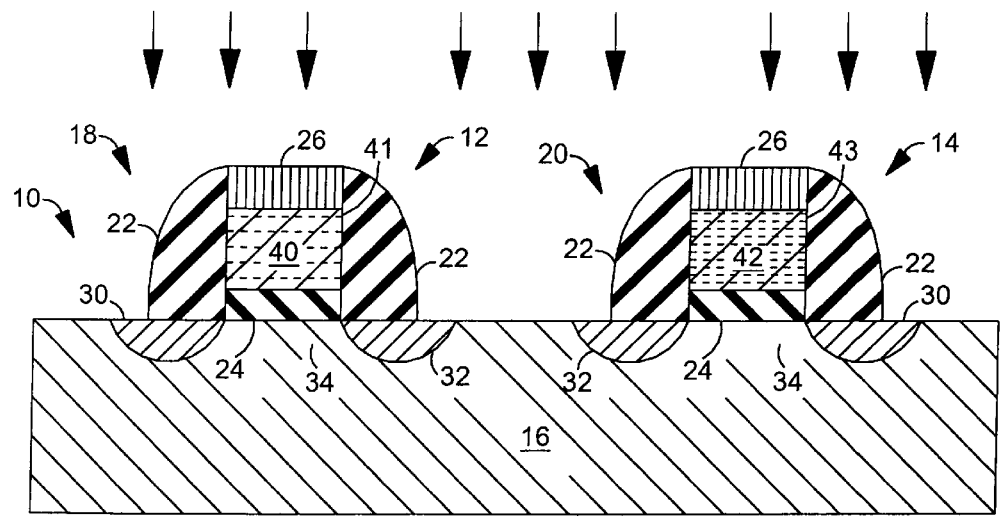
FIG. 1 is a cross-sectional view of a portion of an integrated circuit including a silicon/germanium gate conductor.

With reference to FIG. 1, a portion 10 of an integrated circuit (IC) or chip includes a transistor 12 and a second transistor 14. Portion 10 is preferably part of an ultra-large-scale integrated (ULSI) circuit having 1,000,000 or more transistors. Portion 10 is manufactured as part of the IC on a semiconductor wafer, such as, a silicon wafer.

Transistors 12 and 14 are disposed on a substrate 16 that is preferably silicon. Transistor 12 includes a gate stack 18, and transistor 14 includes a gate stack 20. Each of gate stack 18 and gate stack 20 includes side wall spacers 22, a gate dielectric 24, and a protection layer 26. Protection layer 26 is preferably silicon oxide nitride (SiON) or nitride material. Spacers 22 and dielectric 24 can be silicon dioxide or other insulating material. Spacers 22 are deposited as a silicon dioxide layer by chemical vapor deposition (CVD), which is selectively etched. Dielectric 24 is thermally grown. Alternatively, spacers 22 can be a nitride material or other insulative.

Transistors 12 and 14 also both include a drain 30, a source 32, and a channel 34. Channel 34 of transistor 12 has almost identical characteristics to channel 34 of transistor 14. Transistors 12 and 14 are made with the same identical channel implant to avoid short-channel performance degradation. Therefore, additional channel implants are not utilized in the manufacture of portion 10. Transistors 12 and 14 can be N-channel or P-channel transistors.

Gate stack 18 includes a gate conductor 40, and gate stack 20 includes a gate conductor 42. Gate conductors 40 and 42 are preferably manufactured from a semiconductor material, such as, polysilicon, and are doped or implanted with another semiconductor material, such as, germanium. Gate conductors 40 and 42 are also heavily doped with a P-type dopant, such as, boron.

Gate conductor 40 is made from material 41, having a lower concentration of germanium than material 43 of gate conductor 42, as indicated by the lighter shading of gate conductor 40. Consequently, if transistors 12 and 14 are P-channel MOSFETs, transistor 12 has a lower threshold voltage than transistor 14 due to the lower concentration of germanium in material 41. If transistors 12 and 14 are N-channel transistors, transistor 12 has a higher threshold voltage due to the higher concentration of germanium in material 43. Preferably, transistor 12 is utilized in a critical signal path, and transistor 14 is utilized in a non-critical signal path, if transistors 12 and 14 are P-channel transistors.

Exemplary values for transistors 12 and 14 (N-channel) are given below. Transistor 12 has a threshold voltage of approximately 0.32 volts, and transistor 14 has a threshold voltage of approximately 0.2 volts. Material 41 of transistor 12 has a concentration of germanium of approximately 10%, and material 43 of transistor 14 has a concentration of germanium of approximately 40%. The difference in the threshold voltage of transistors 12 and 14 is related to the difference in the germanium concentration between materials 41 and 43, where material 41 is $Si_{(1-x)}Ge_x$ and material 43 is $Si_{(1-y)}Ge_y$. Conversely, if transistors 12 and 14 are P-channel transistors, transistor 12 has a lower threshold voltage than transistor 14.

The threshold voltage is controlled by the work function associated with gate stacks 18 and 20. The work function is related to the fraction of germanium in the polysilicon associated with materials 41 and 43. The germanium composition modifies the valence band level (not the conduction band level) so the work function is decreased as the germanium concentration is increased.

As an example, when transistors 12 and 14 (N-channel) have an identical N-channel implant, and transistor 12 has a 10% molar concentration of germanium in material 41, while transistor 14 has a 40% molar concentration of germanium in material 43, the gate work function associated with transistor 12 is approximately 120 mV greater than that of transistor 14. Therefore, the threshold voltage (Vth) of transistor 12 is 120 mV greater than that of transistor 14. Accordingly, dual-Vth transistors for portion 10 can be designed without changing the channel implant.

Transistors 12 and 14 can be any type of transistor. Most preferably, transistors 12 and 14 are MOSFET transistors and can be either P-channel or N-channel MOSFET transistors. The MOSFET transistors 12 and 14 can have threshold voltages from 0.2 V or less to over 0.7 V. Preferably, the threshold voltage of transistors 12 and 14 is between 0.2 and 0.4 V. Isolation and connections between transistors 12 and 14 are not shown in FIGS. 1–5 for simplicity.

Depending upon the concentration of germanium in materials 41 and 43, the threshold voltage value can be changed within a range. For example, from a 0% germanium concentration to a 60% germanium concentration, the threshold voltage can differ by approximately 240 mV, thereby giving a circuit designer a large window to select threshold voltages for different paths. Further, the design of transistors 12 and 14 with the advantageous gate structure decouples the variation of threshold voltages from parameters of the channel, thereby making transistor design simpler and fabrication less complicated.

Figure 2:
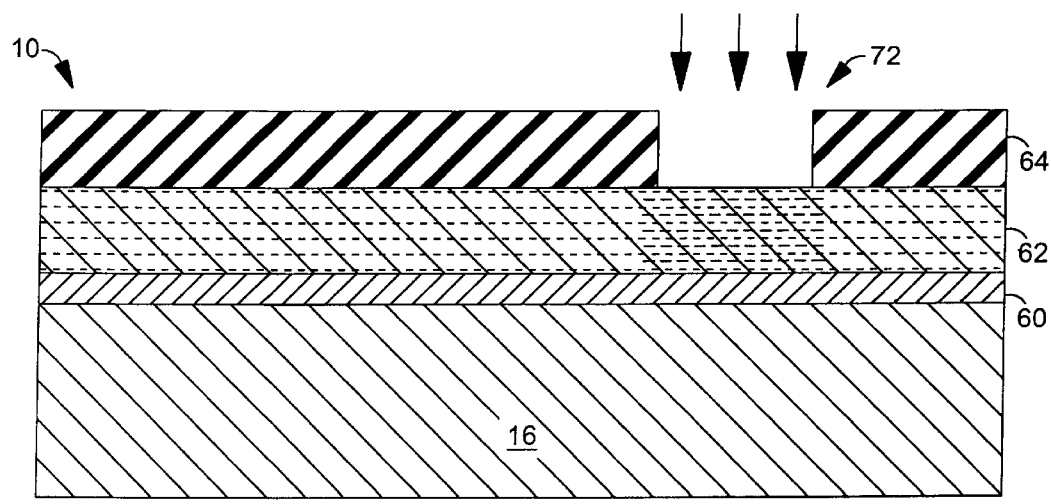
FIG. 2 is a cross-sectional view of the portion of the integrated circuit illustrated in FIG. 1, showing a germanium ion implant step.

With reference to FIGS. 1–4, the fabrication of portion 10, including transistors 12 and 14, is described below as follows. In FIG. 2, portion 10 includes substrate 16 beneath a gate oxide layer 60 that is beneath a polysilicon and germanium layer 62. Layer 62 is substantially covered with a photoresist layer 64.

Substrate 16 is preferably a silicon substrate, and layer 60 is preferably a gate dielectric layer for dielectric 24 (FIG. 1). Layer 60 can be thermally grown silicon dioxide. Layer 62 is a semiconductor material implanted with another semiconductor material, such as, polysilicon/germanium, $Si_{(1-x)}Ge_x$. The concentration of germanium can be zero (x=0) or higher. Layer 62 is exposed to germanium ions through an aperture 72 in photoresist layer 64. The region associated with aperture 72 becomes a polysilicon/germanium material doped with more germanium ions, $Si_{(1-y)}Ge_y$, (e.g., material 43 (FIG. 4), where y is greater than x). Layer 62 is doped or implanted with germanium by an ion implantation technique.

Layer 62 is deposited on top of layer 60 (FIGS. 2 and 3) by chemical vapor deposition (CVD). After deposition, layer 62 can be heavily doped with boron to become a P+ type material and implanted with germanium by the ion implantation process to become material 41 (FIG. 4). Alternatively, layer 62 could be deposited as doped polysilicon, with germanium already included. Layer 64 is preferably photoresist, and a photolithographic technique is utilized to define aperture 72. Aperture 72 is preferably as wide or slightly wider than stack 20 (FIG. 1).

Figure 3:
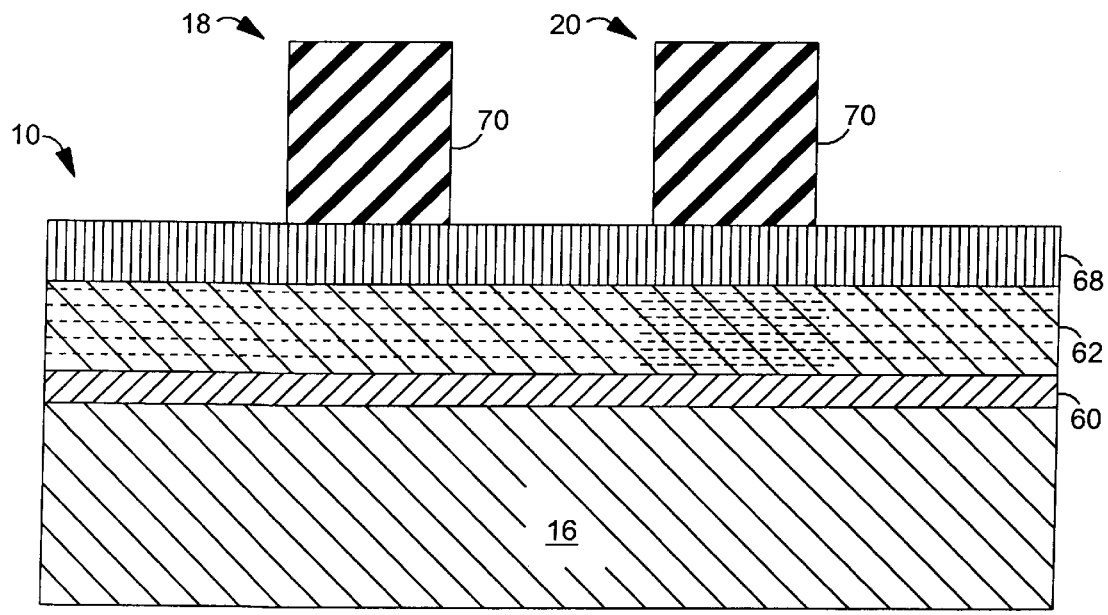
FIG. 3 is a cross-sectional view of the portion of the integrated circuit illustrated in FIG. 1, showing a photoresist removal step.
Figure 4:
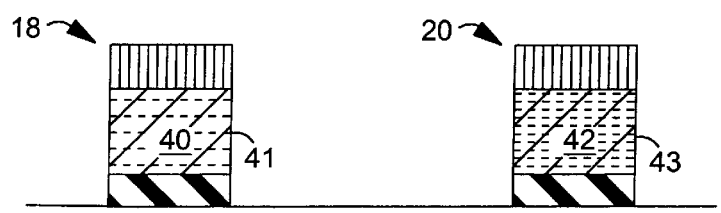
FIG. 4 is a cross-sectional view of the portion of the integrated circuit illustrated in FIG. 1, showing a gate stack formation step.

With reference to FIG. 3, layer 64 is stripped, and a protection layer or barrier layer 68 is deposited over layer 62. Layer 68 can be a siliconoxynitride (SiON) or nitride material. Layer 68 is preferably deposited under low temperature (e.g., less than 400° C.) by CVD and becomes protective layer 26 (FIG. 1).

Layer 68 protects layer 62 for later source and drain implant steps associated with the formation of transistors 12 and 14. Layer 68 also advantageously allows a P+ type gate to be utilized for both N-channel and P-channel MOSFETs. Layer 68 can be doped with boron (P+) when drains 30 and sources 32 are formed for P-channel transistors.

After layer 68 is deposited, a photoresist layer 70 is deposited and selectively etched in accordance with gate stacks 18 and 20. Portion 10 is plasma-etched or dry-etched to form gate stacks 18 and 20 (FIG. 1 and FIG. 4). In FIG. 4, after etching, layer 70 is removed. Gate stack 18 includes material 41, and gate stack 20 includes material 43. Gate stacks 18 and 20 can be formed by a variety of fabrication techniques. With reference to FIG. 1, conventional transistor processes can be utilized to form drains 30, sources 32, contacts, and interconnectors for portion 10.

Alternatively, conductors 40 and 42 could be doped in accordance with an amorphous silicon process as discussed below with reference to FIGS. 6–9, where a germanium layer is provided on top of a silicon layer. The germanium and silicon layers are subjected to an amorphization process and melted to form conductors 40 and 42 as polysilicon material doped with germanium. In another alternative, conductors 40 and 42 can be formed in a damascene process as discussed below with reference to FIGS. 15–20. In this process, dummy polysilicon conductors are removed and replaced with polysilicon conductors that are selectively doped with germanium.

Figure 5:
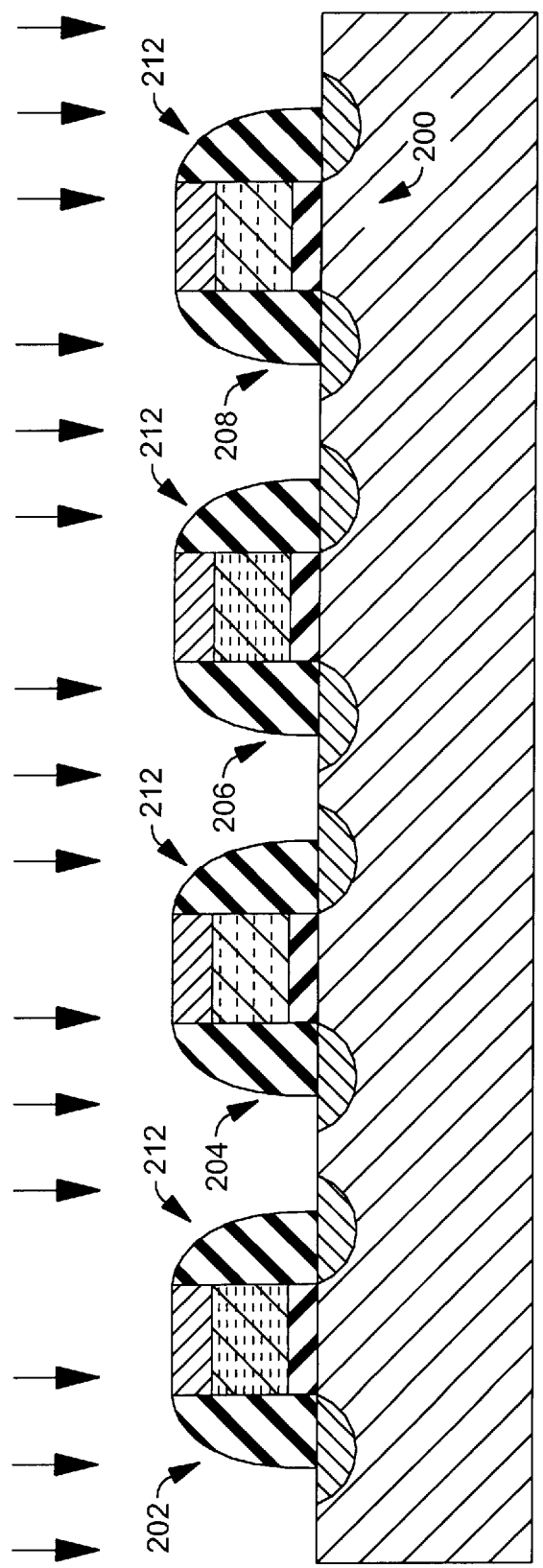
FIG. 5 is a cross-sectional view of a portion of another integrated circuit including a silicon/germanium gate conductor.

With reference to FIG. 5, a portion 200 of an IC includes transistors 202, 204, 206, and 208 (N-channel or P-channel), which are fabricated in accordance with a similar process described with reference to FIGS. 1–4. Assuming transistors 202, 204, 206, and 208 are N-channel devices, the threshold voltage associated with transistor 202 is lower than the threshold voltages of transistors 204, 206, and 208. The threshold voltage of transistor 204 is higher than the threshold voltages of transistors 206 and 208. Transistor 208 has a higher threshold voltage than transistor 206. Thus, portion 200 includes transistors having four different threshold voltages. Threshold voltages of transistors 202, 204, 206, and 208 are controlled by the amount of germanium concentration in gate structures 212 associated with transistors 202, 204, 206, and 208. Unlike the process described in FIGS. 1–4, several germanium implantation steps are necessary to appropriately implant gates 212. The implant steps require several photoresist masks to appropriately provide the correct concentrations of germanium in gates 212.

Figure 6:
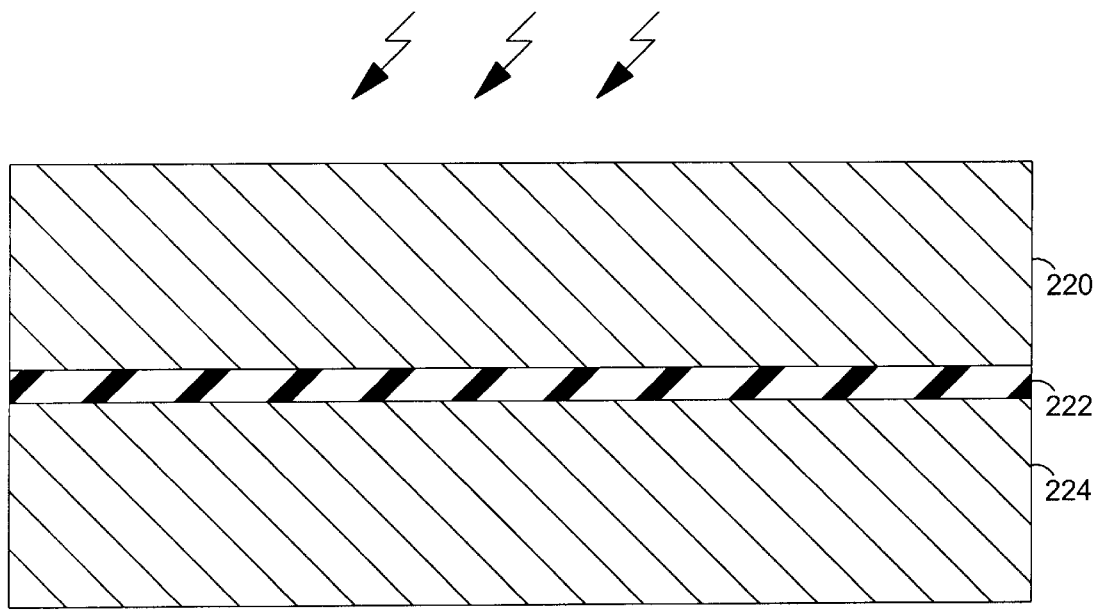
FIG. 6 is a cross-sectional view of a polysilicon/germanium film, the germanium film can be utilized in the portion of the integrated circuit illustrated in FIG. 1.

With reference to FIG. 6, a germanium/polysilicon film 220 can be utilized on portion 10 (FIG. 1) and on portion 200 (FIG. 5) as a gate conducting material, such as, materials 41 and 43. Alternatively, film 220 can be utilized in other conductive positions of the integrated circuit. Film 220 is provided over a gate oxide layer 222 that is provided over a silicon substrate 224.

Film 220 is preferably a heavily doped polysilicon/germanium film that can be doped with N-type dopants or P-type dopants. Additionally, film 220 preferably has a box-like dopant profile and is preferably a $Si_{(1-x)}Ge_x$ material, where x is the molar concentration of germanium.

Figure 7:
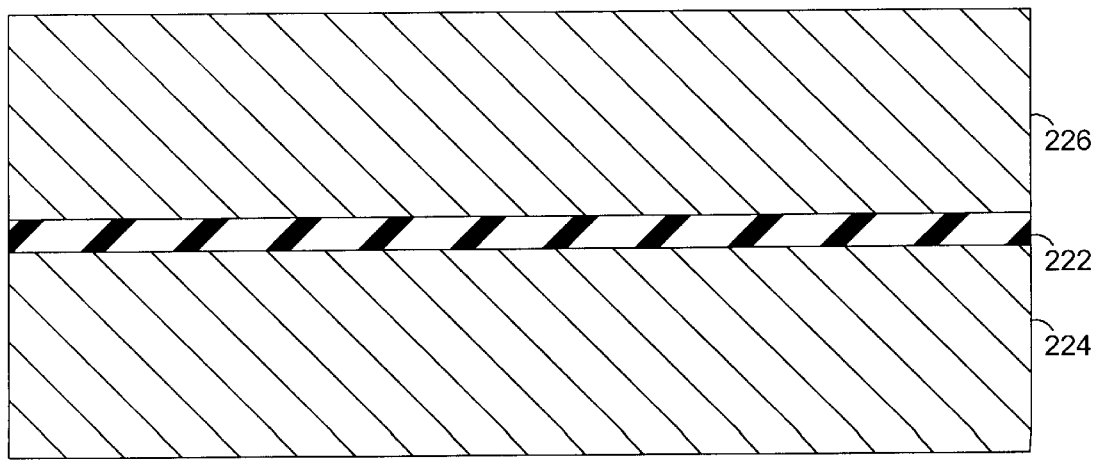
FIG. 7 is a cross-sectional view of the polysilicon/germanium film illustrated in FIG. 6, showing an amorphous silicon deposition step.

With reference to FIGS. 6–9, the manufacture of film 220 is described below as follows. In FIG. 7, an amorphous silicon layer 226 is deposited by low pressure chemical vapor deposition (LPCVD) on top of layer 222. Layer 226 is preferably between 100 nm and 200 nm thick and is deposited at a temperature below 500° C. Layer 226 has a smaller crystal size than film 220 (FIG. 6). Layer 222 can be a 2–4 nm oxide layer, a 30–50 nm thick nitride layer, or other dielectric layer.

Figure 8:
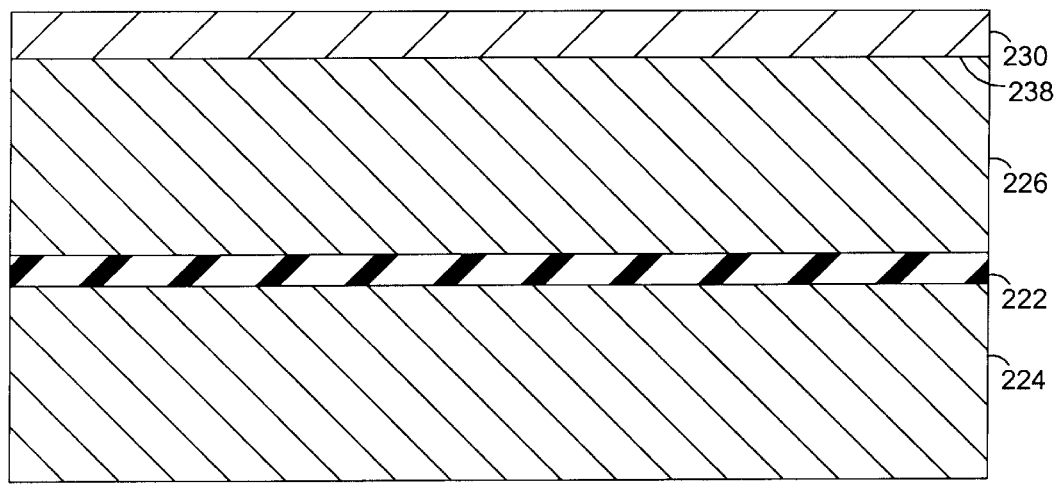
FIG. 8 is a cross-sectional view of the polysilicon/germanium film illustrated in FIG. 6, showing an amorphous germanium deposition step film.

With reference to FIG. 8, an amorphous germanium layer 230 is deposited by LPCVD over a top surface 238 of layer 226. Layer 230 is preferably a thin layer of amorphous germanium deposited at a temperature below 500° C. Preferably, layer 230 is between 10 and 20 percent of the total thickness of layers 230 and 226 (e.g., between 10 and 40 nm). The thickness of layers 226 and 230 can be dependent upon the desired composition of film 220 (e.g., the value for x). Accurate control of germanium concentration can be obtained by adjusting the thickness ratio between layers 226 and 230.

Figure 9:
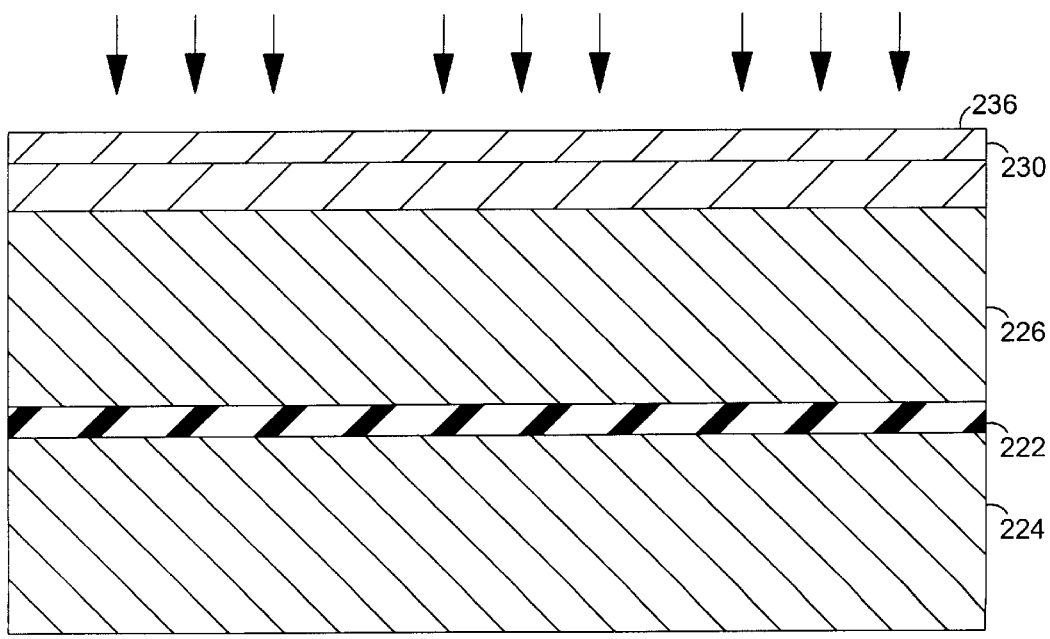
FIG. 9 is a cross-sectional view of the polysilicon/germanium film illustrated in FIG. 6, showing a dopant implant step.

With reference to FIG. 9, layers 226 and 230 are subjected to a dopant implant. A dopant, such as, arsenic, phosphorus, boron, or boron difluoride (BF2), can be implanted about surface 238 (FIG. 8). Preferably, the implant is performed under small implant energy so the projection is relatively shallow below a top surface 236 of layer 230. Multiple implants using different types of dopants can be utilized to increase the dopant concentration within layers 226 and 230, until a level close to the solid solubility limit of layers 226 and 230 is reached. The dopants are preferably implanted in an ion implantation process, wherein the peak of the dopant concentration is centered approximately one-quarter of the thickness of the combination of layers 226 and 230 (e.g., below surface 236 by 25–50 nm). The implant is sufficiently shallow to avoid significant dopant tail effect into layer 222.

With reference to FIG. 6, layers 226 and 230 (FIG. 9) are subjected to an excimer laser annealing process to melt layers 226 and 230. During the laser annealing, dopants diffuse evenly throughout film 220 in a box-like profile. The laser annealing process also electrically activates dopants in layers 226 and 230 (FIG. 9) at the same time. The excimer laser annealing process preferably heats layers 226 and 230 above the melting point of amorphous silicon (e.g., 800° C.). Preferably, annealing provides a local temperature above the melting point of amorphous germanium (between approximately 900° C. and 1000° C.).

After the laser annealing step, film 220 is recrystalized as polysilicon with electrically activated impurities. The excimer laser annealing process activates the dopants more quickly than conventional thermal annealing processes. Alternatively, other annealing, thermal, or heating processes can be utilized to activate and diffuse dopants.

The method discussed with reference to FIGS. 6–9 advantageously provides a uniform dopant and germanium profile in film 220. Unlike conventional processes, in which the dopant distribution and the gate material has a Gaussian-like profile, and the physical dopant concentration near the gate electrode/gate oxide interface is relatively low, film 220 obtains a uniform box-like dopant profile. The evenly distributed germanium profile in film 220 is independent of subsequent thermal steps. A stable germanium composition near the gate oxide interface (interface between gate oxide layer 222 and film 220) is advantageously achieved, and gate depletion effect is minimized.

Figure 10:
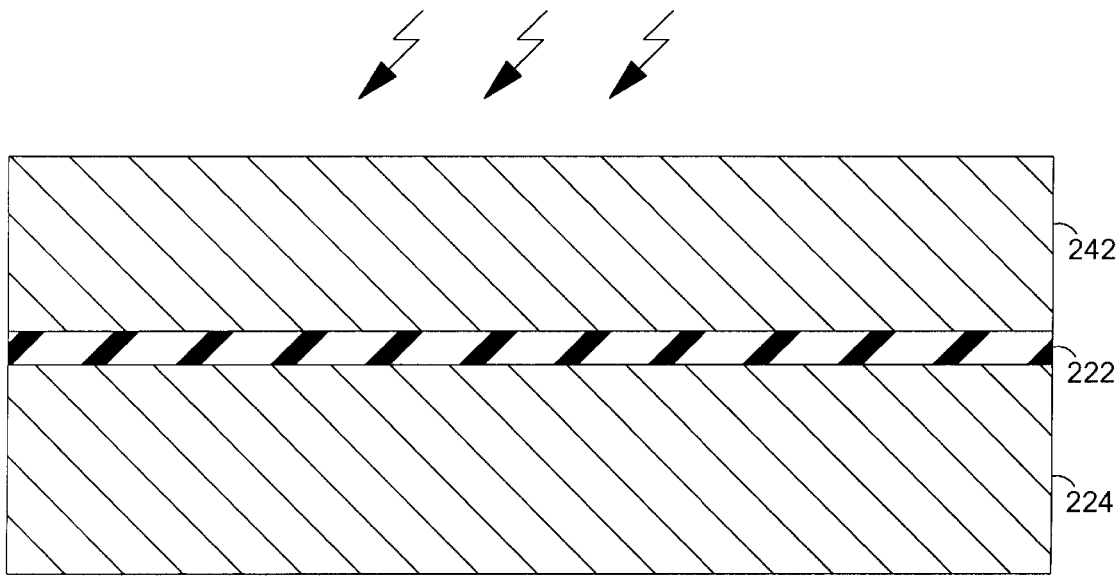
FIG. 10 is a cross-sectional view of a polysilicon film, the polysilicon film can be utilized in the portion of the integrated circuit illustrated in FIG. 1.

With reference to FIG. 10, a film of a polysilicon film 242 is similar to polysilicon/germanium film 220 discussed with reference to FIGS. 6–9. Film 242 can be manufactured in a process similar to the process used to manufacture film 220. However, film 242 does not include germanium. Film 242 is provided on layer 222, which is provided on substrate 224. Film 242 has a box-like profile of evenly diffused dopant. Film 220 can be utilized in portion 10 or in portion 200, discussed with reference to FIGS. 1 and 5.

Figure 11:
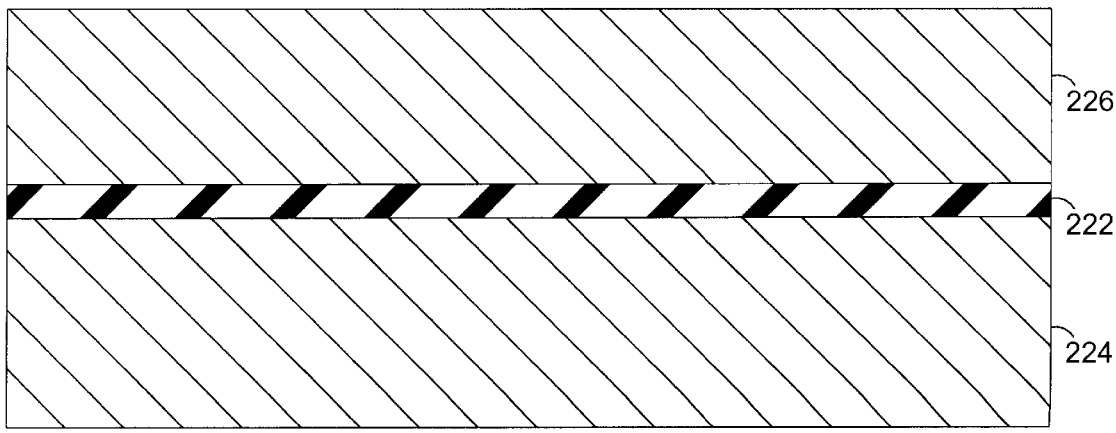
FIG. 11 is a cross-sectional view of the polysilicon film illustrated in FIG. 10, showing an amorphous silicon deposition step.

The manufacture of film 242 is discussed below with reference to FIGS. 10–12. In FIG. 11, an amorphous silicon layer 226 is deposited by LPCVD on top of layer 222. Layer 226 is preferably 100 nm –200 nm thick and deposited at a temperature of below 500° C.

Figure 12:
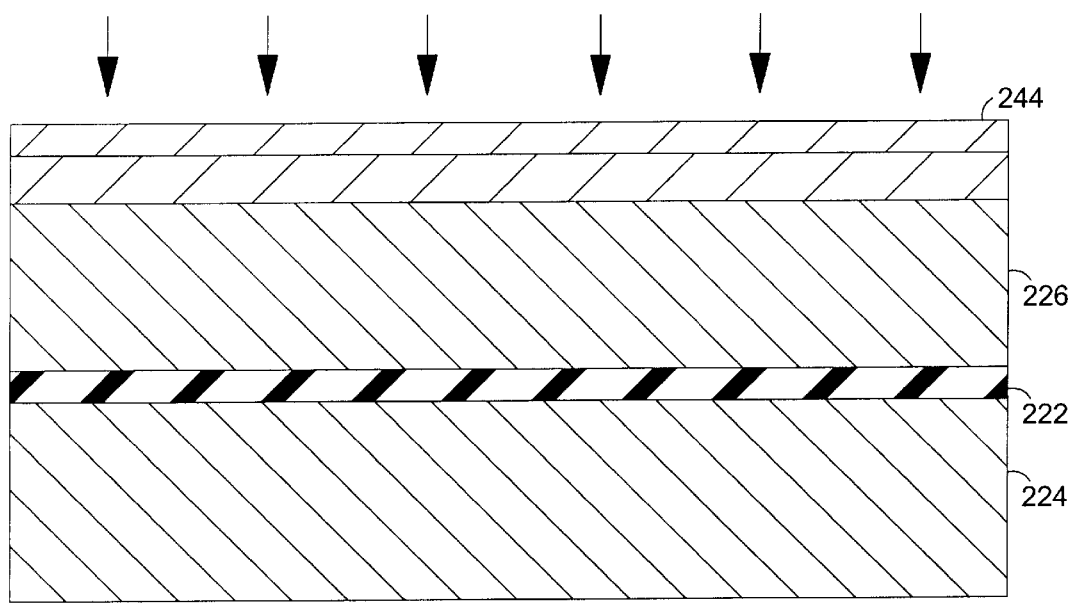
FIG. 12 is a cross-sectional view of the polysilicon film illustrated in FIG. 1, showing a dopant implant step.

In FIG. 12, layer 226 receives a dopant implant. The dopant implant is preferably provided at a shallow projection. Multiple implants can be utilized to increase the dopant concentration until layer 226 is close to its solid solubility limit. Preferably, the dopant region is within or centered about the thickness of layer 226, below a top surface 244. The dopant implant is sufficiently shallow to avoid dopant tail effect into layer 222 (approximately 25 to 50 nm below surface 244).

With further reference to FIG. 10, layer 226 (FIG. 12) is subject to excimer laser annealing to melt layer 226. The excimer laser annealing diffuses dopant evenly through film 242 in a box-like profile. The excimer laser annealing preferably provides a local temperature between 900° C. and 1000° C. for film 242, thereby activating electrically activating dopants. Film 242 is recrystalized as polysilicon after heating. Alternatively, film 242 could be heated by other processes to activate dopants and to recrystalize film 242.

Figure 13:
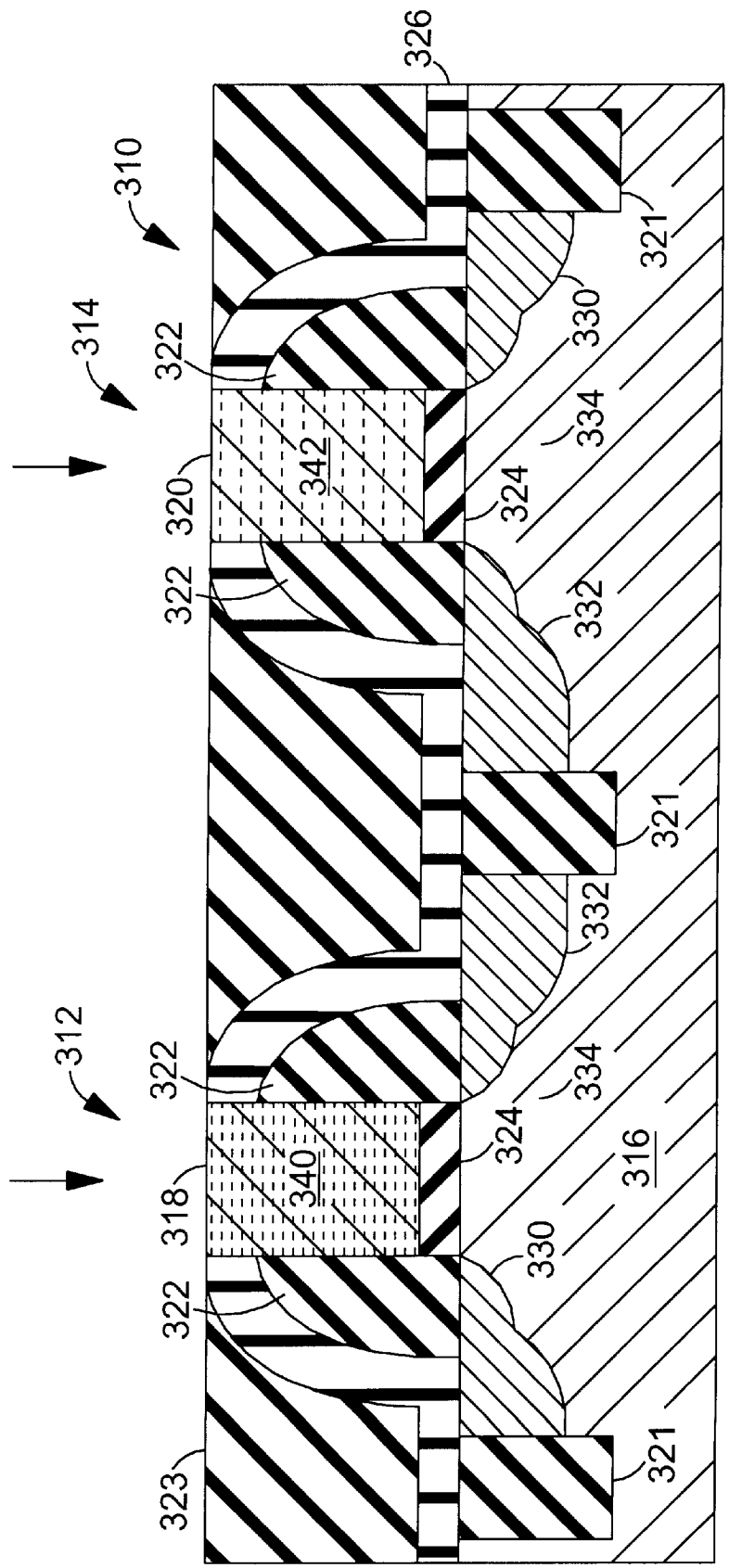
FIG. 13 is a cross-sectional view of a portion of yet another integrated circuit including a polysilicon/germanium gate conductor.

With reference to FIG. 13, a portion 310 of an IC or chip includes a transistor 312 and a transistor 314. Portion 310 is preferably part of a ULSI circuit and can be similar to portion 10 (FIG. 1).

Transistors 312 and 314 are disposed on a substrate 316 that is preferably silicon. Transistor 312 includes a gate stack 318, and transistor 314 includes a gate stack 320. Each of gate stack 318 and gate stack 320 includes side wall spacers 322, a gate dielectric 324, and a protection or barrier layer 326. Protection layer 326 is preferably a $SiO_xN_y$ layer that is utilized as a polish stopper. An insulative layer 323 is deposited over protection layer 326. Layer 323 can be silicon dioxide deposited in a tetraorthosilicate (TEOS) process.

Transistors 312 and 314 both include a drain 330, a source 332, and a channel 334. Channel 334 of transistor 312 has almost identical characteristics to channel 334 of transistor 314. Transistors 312 and 314 are made with the same identical channel implant to avoid short-channel performance degradation and can be similar to transistors 12 and 14 (FIG. 1). Transistors 312 and 314 are separated by shallow isolation trenches 321.

Gate stack 318 includes a gate conductor 340, and gate stack 320 includes a gate conductor 342. Gate conductors 340 and 342 are preferably manufactured from a semiconductor material, such as, polysilicon, and are both implanted with another semiconductor material, such as, germanium. Gate conductors 340 and 342 are also heavily doped with a P-type dopant, such as, boron. Gate conductor 340 has a higher concentration of germanium than gate conductor 342, as indicated by the lighter shading of gate conductor 342.

Consequently, if transistors 312 and 314 are P-channel MOSFETs, transistor 314 has a lower threshold voltage than transistor 312 due to the lower concentration of germanium in conductor 342. If transistors 312 and 314 are N-channel transistors, transistor 314 has a higher threshold voltage due to the higher concentration of germanium in conductor 340. Transistors 312 and 314 can have similar exemplary values, as described with reference to transistors 12 and 14 in FIGS. 1–5.

Figure 14:
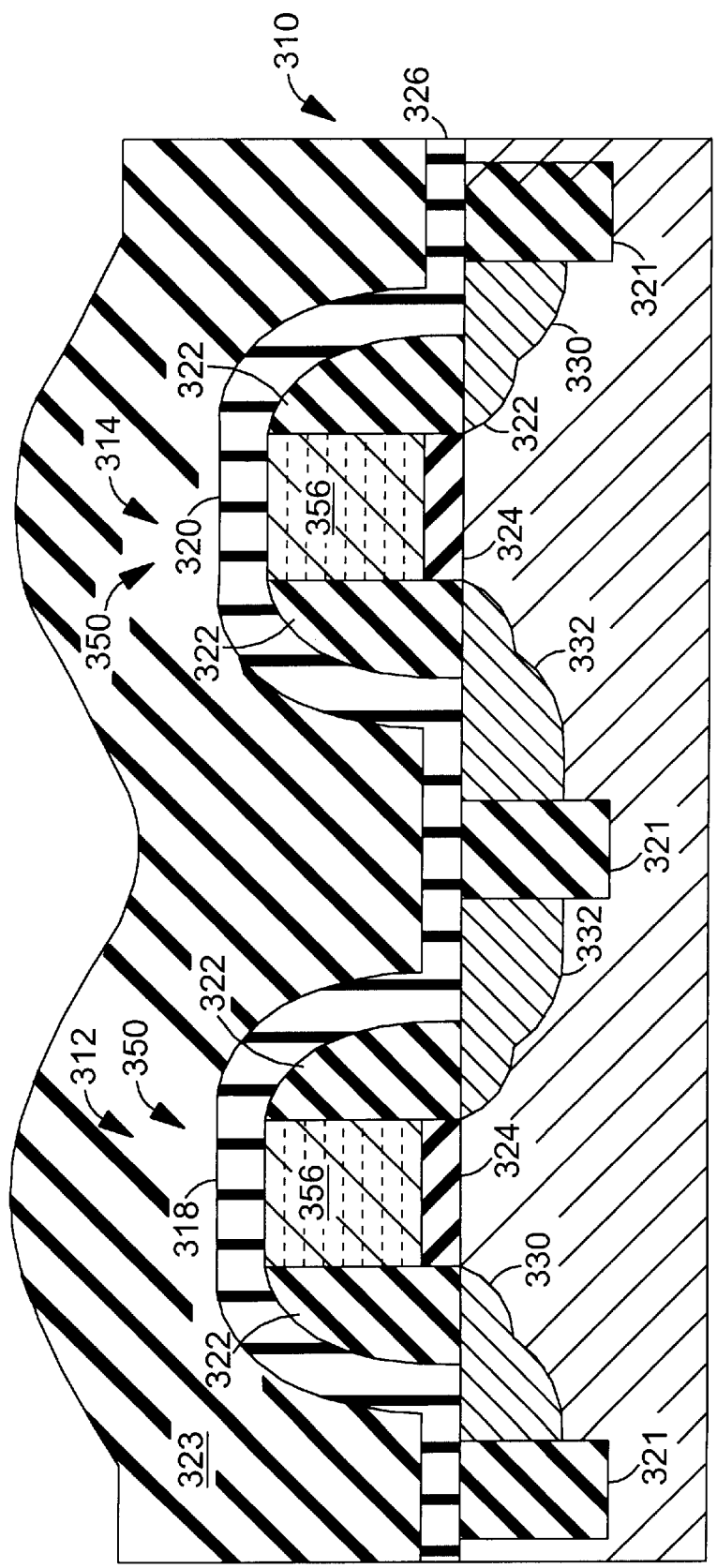
FIG. 14 is a cross-sectional view of the portion of the integrated circuit illustrated in FIG. 13, showing dummy gate structures.

With reference to FIGS. 13–18, the fabrication of portion 310, including transistor 312 and 314, is described below as follows. In FIG. 14, portion 310 includes transistors 312 and 314 having dummy gate structures or stacks 350. Dummy gate stacks 350 include an undoped polysilicon material 356, dielectric 324, and spacers 322. Alternatively, material 356 can be other types of semiconductor materials. Stacks 350 are covered by barrier layer 326 made of siliconoxynitride (SiOxNy), which is overcoated by an insulative layer 323. Layer 323 can be an oxide layer. Transistors 312 and 314, including stacks 350, can be fabricated according to conventional processes.

Figure 15:
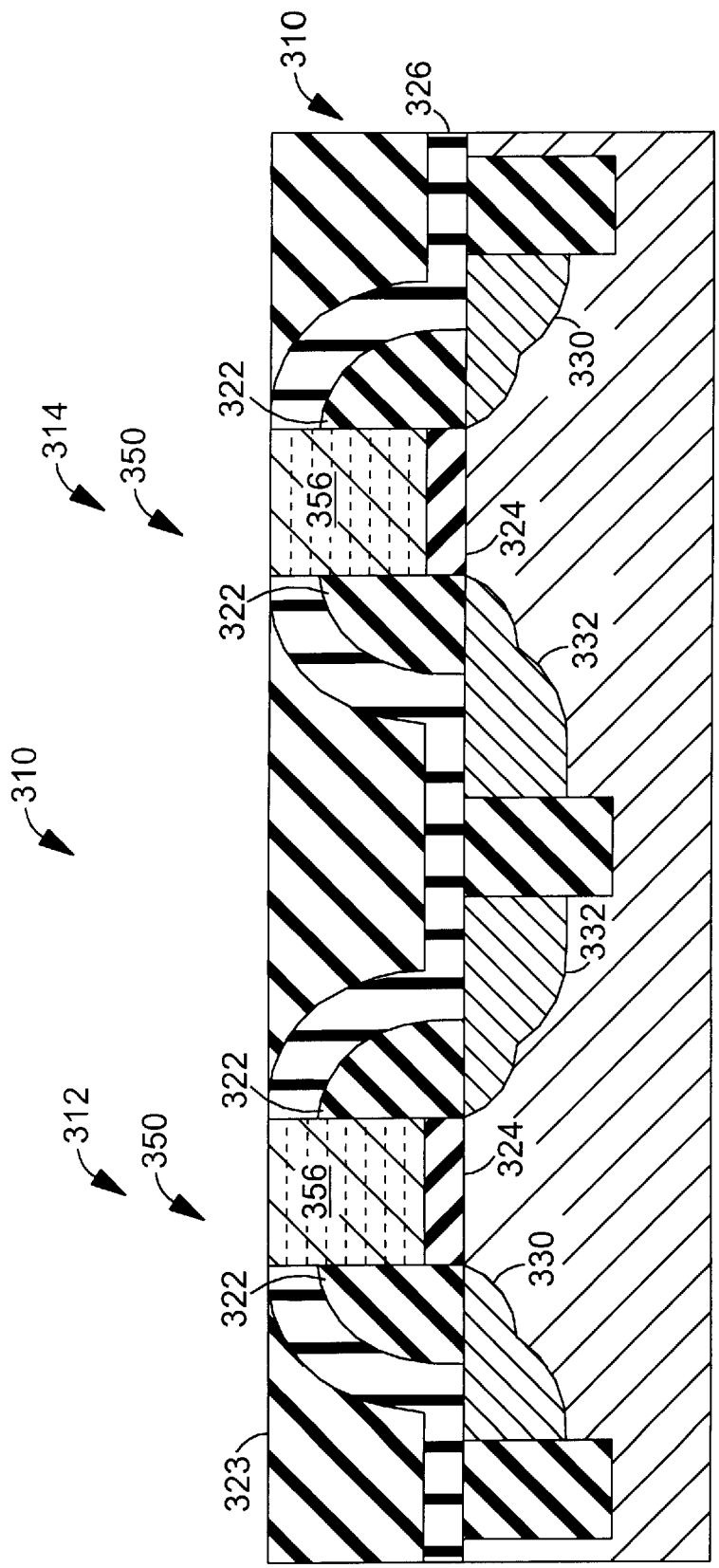
FIG. 15 is a cross-sectional view of the portion of the integrated circuit illustrated in FIG. 13, showing a chemical-mechanical polish (CMP) step.
Figure 16:
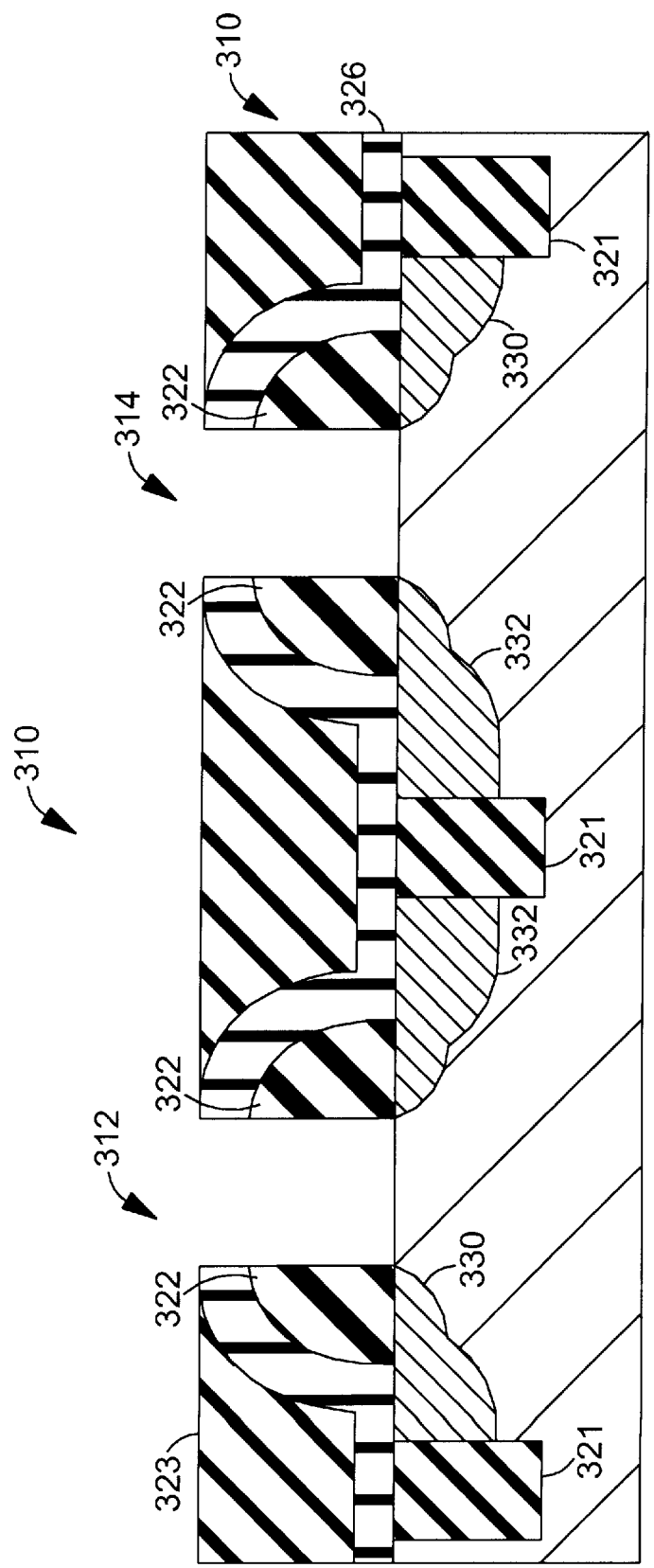
FIG. 16 is a cross-sectional view of the portion of the integrated circuit illustrated in FIG. 13, showing a wet-etching step.
Figure 17:
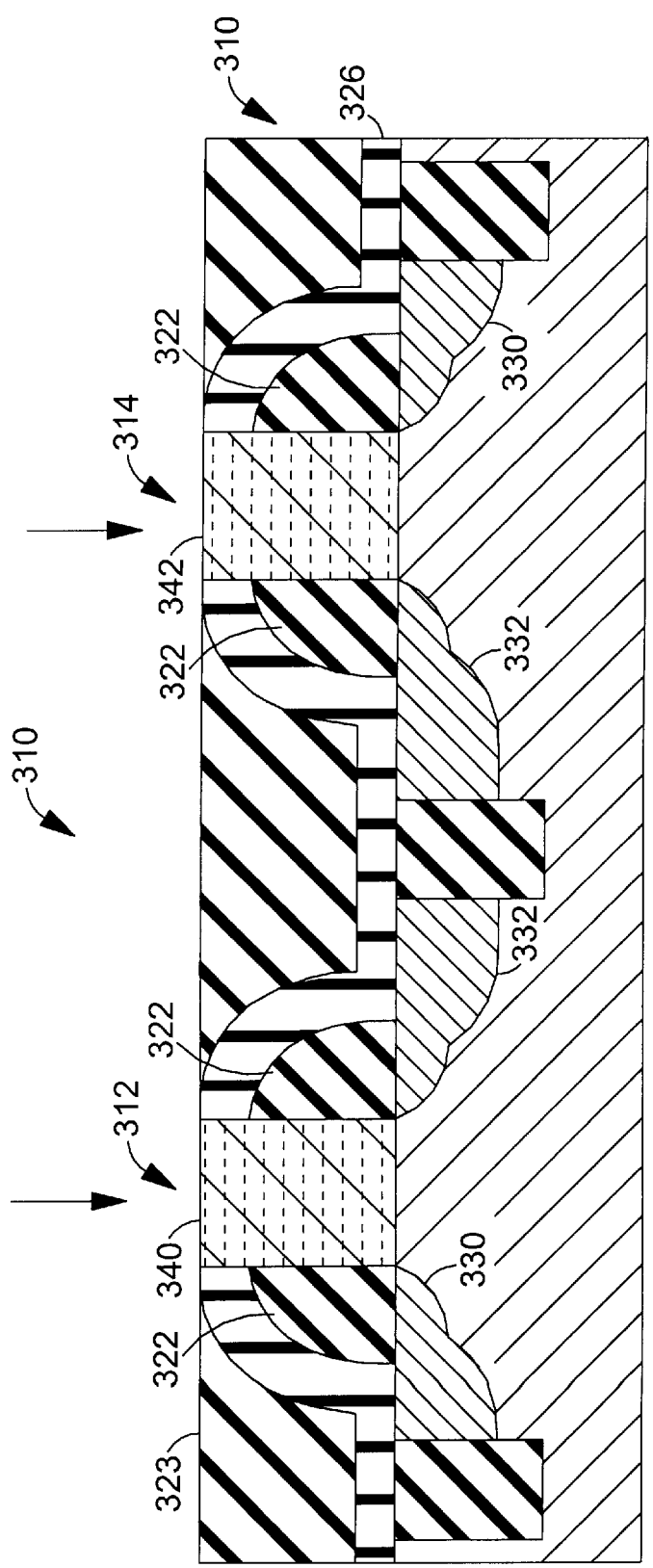
FIG. 17 is a cross-sectional view of the portion of the integrated circuit illustrated in FIG. 13, showing a refill step.

In FIG. 15, portion 310 is subject to a chemical-mechanical polish (CMP) to remove a portion of insulative layer 323. Portion 310 is subject to the CMP until layer 323 is removed from the top of dummy stacks 350. In FIG. 16, polysilicon material 356 is removed by wet-etching selective to polysilicon. Alternatively, dry-etching or other stripping techniques can be utilized to remove polysilicon material 356 from dummy stacks 350. In FIG. 17, gate conductors 340 and 342 are provided in-situ for transistors 312 and 314, respectively. Preferably, P+-type doped polysilicon/germanium is deposited and etched back to leave a form of conductors 340 and 342 between spacers 322. Alternatively, polysilicon can be deposited and implanted with germanium.

Figure 18:
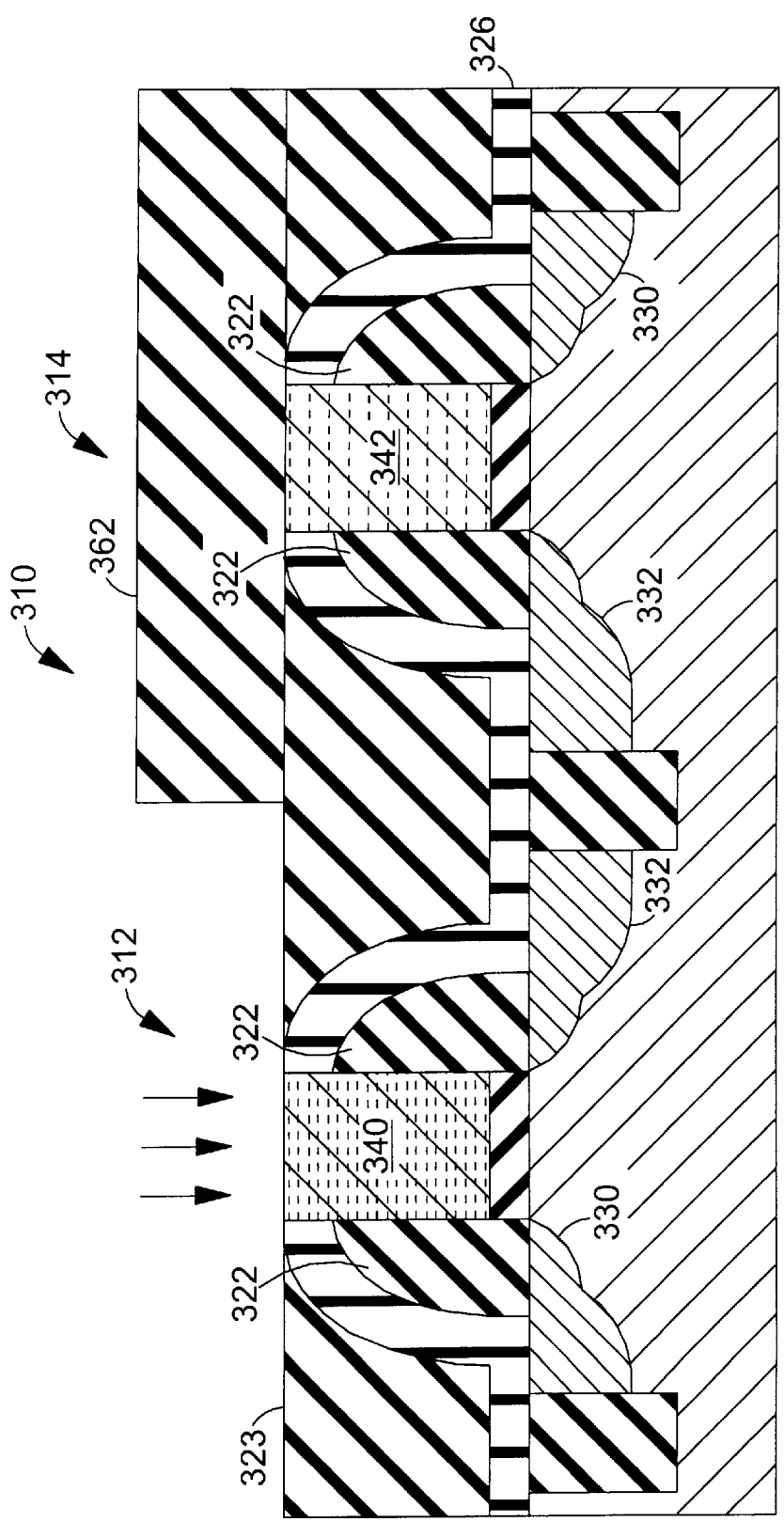
FIG. 18 is a cross-sectional view of the portion of the integrated circuit illustrated in FIG. 13, showing a germanium implantation step.

With reference to FIG. 18, transistor 314 is covered by a photoresist layer 362. After transistor 314 is covered, gate conductor 340 associated with transistor 312 is implanted with germanium ions to a concentration so that conductor 340 is composed of a $Si_{(1-y)}$ $Ge_y$ material, and conductor 342 is composed of a $Si_{(1-x)}$ $Ge_x$ material, where y is greater than x. Alternatively, in FIG. 17, conductors 340 and 342 can be provided as undoped polysilicon and doped in subsequent steps. Additionally, in FIG. 18, a photoresist layer similar to layer 362 can be provided over transistor 314 and ion (e.g., germanium) implantation can be provided to conductor 342. In still further alternatives, conductors 340 and 342 can be provided as films 220 and 242 (FIG. 6 and FIG. 10, respectively).

Figure 19:
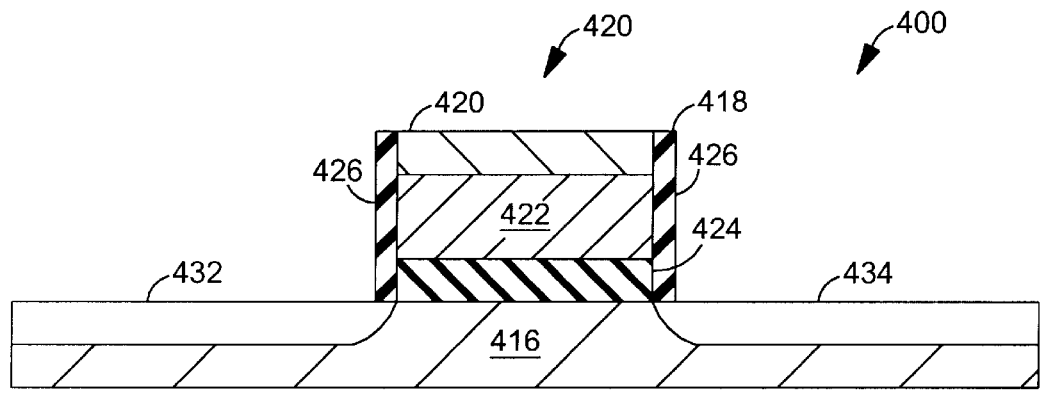
FIG. 19 is a cross-sectional view of a portion of a integrated circuit including a semiconductor/germanium gate conductor in accordance with an exemplary embodiment.

With reference to FIG. 19, a portion of an integrated circuit 400 includes a transistor 412. Transistor 412 can be utilized as one of transistors 12 and 14 in FIGS. 1–4, transistors 202, 204, 206 and 208 in FIG. 5, or transistors 312 and 314 in FIG. 13. Transistor 412 is disposed on a semiconductor substrate 416 which is preferably silicon. Transistor 412 can be a P-channel or N-channel transistor. Transistor 412 can have a threshold voltage between 0.2 volts and 0.32 volts depending upon germanium concentration in conductor 422 (assuming an N-channel transistor).

Transistor 412 includes a gate structure or stack 418. Gate stack 418 is located between a source 432 and a drain 434. Stack 418 includes a semiconductor buffer layer 420, a semiconductor and germanium conductor 422 and a gate insulator layer 424. Additionally, spacers 426 are made of silicon nitride and are provided on side walls of stack 418 (laterally about conductor 422). Conductor 422 is a thin film similar to film 220 discussed with reference to FIGS. 6–9.

Buffer layer 420 is preferably a 10 nm thick polysilicon layer directly on top of conductor 422. Conductor 422 is preferably a 100–200 nm thick polysilicon/germanium layer ($Si_xGe_{1-x}$ where x is less than 1). Layer 424 can be deposited or grown silicon dioxide or silicon nitride. Preferably, layer 424 is 15–40 Å thick.

Spacers 426 are preferably 10–15 rim wide. Spacers 426 act as a protecting layer to prevent germanium outgassing from the side walls of gate stack 18. Additional insulative material can be provided adjacent spacers 426. For example, conventional dielectric spacers such as silicon dioxide can be provided adjacent spacers 426 of gate stack 418.

Figure 20:
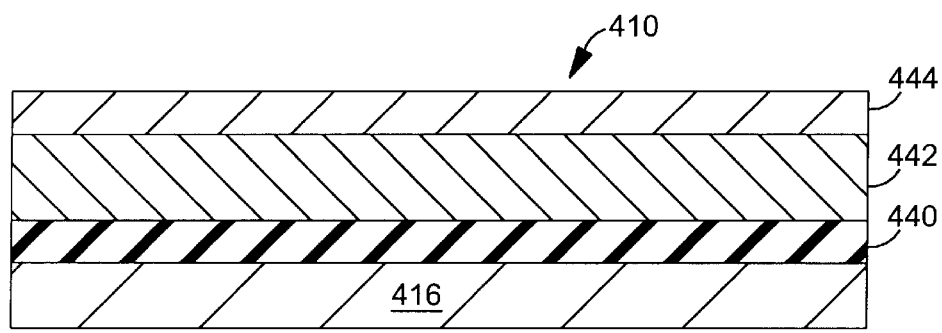
FIG. 20 is a cross-sectional view of a portion of the integrated circuit illustrated in FIG. 19, showing a semiconductor/germanium deposition step.

With reference to FIGS. 19–23, the fabrication of the portion of integrated circuit 400 including transistor 412 is described below as follows. In FIG. 20, substrate 416 is covered by a layer 440 associated with gate insulator layer 424 (FIG. 19). Layer 440 is preferably thermally grown silicon dioxide material having a thickness of 15–40 Å.

A semiconductor/germanium layer 442 associated with gate conductor 422 (FIG. 19) is preferably deposited by low pressure chemical vapor deposition (LPCVD) at a temperature between 600 and 650° C. Layer 442 is deposited utilizing a gas source of silane (SiH4) and germane (GeH4). Layer 442 is preferably a polysilicon/germanium thin film having a thickness of 100–200 nm. Alternatively, layer 442 can be an amorphous semiconductor (e.g., silicon) and germanium layer. Layer 442 can be formed by a variety of deposition and growth techniques utilizing a variety of gas sources.

As layer 442 is deposited, the source of germanium (e.g., germane gas) is reduced or turned off. With the source of germanium turned off, a buffer semiconductor layer 444 is formed. Layer 444 corresponds to buffer semiconductor layer 420 (FIG. 19). Preferably, buffer semiconductor layer 444 is approximately a 10 nm thick polysilicon layer deposited by LPCVD utilizing silane as a source. Layer 444 can be deposited in the same process step as layer 442 with similar temperature characteristics. Layer 444 serves to prevent germanium outgassing as discussed below.

Figure 21:
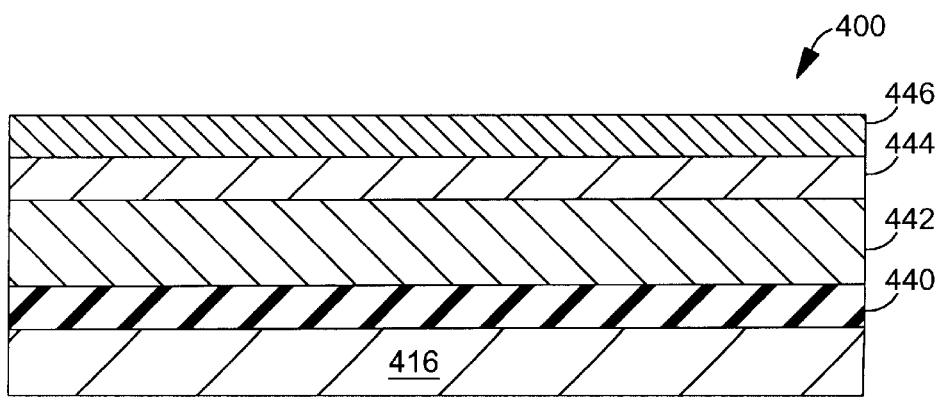
FIG. 21 is a cross-sectional view of the portion of the integrated circuit illustrated in FIG. 1, showing an oxidation step.

In FIG. 21, an oxide layer 446 is formed on top of layer 444. Preferably, layer 446 is a semiconductor oxide layer, such as, silicon dioxide. Layer 446 is preferably from 5 to 8 nm thick.

Layer 446 can be grown in a thermal process. Preferably, substrate 416 is heated to form silicon dioxide on top of layer 444 which polysilicon. Layer 446 consumes approximately 30–40% of the original thickness of layer 444. Layer 446 can be formed by heating substrate 416 to a temperature of 950–1000 C. in an oxygen rich environment for 10–30 seconds. Alternatively, layer 446 can be deposited by CVD.

Layer 446 advantageously prevents germanium outgassing through layer 444 after the LPCVD process. Layer 446 forms an oxide cap or protective layer which does not allow germanium to react with oxygen and exit integrated circuit 400.

Figure 22:
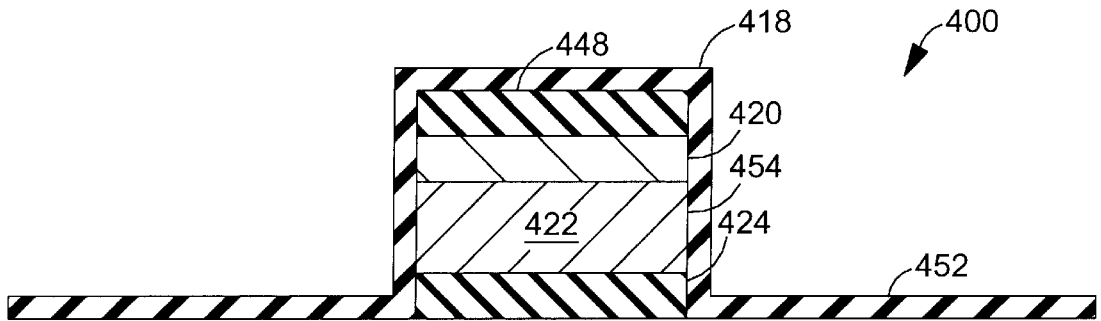
FIG. 22 is a cross-sectional view of the portion of the integrated circuit illustrated in FIG. 19, showing a silicon nitride deposition step.

In FIG. 22, layers 446, 444, 442, and 440 are selectively etched or removed to form a gate stack 418 via patterned lithography. Gate stack 418 includes gate conductor 422, semiconductor buffer layer 420 (layer 444 of FIG. 21), gate dielectric layer 424 and a protective layer 448 (layer 446 in FIG. 21). Layers 448, 420, 422 and 424 can be selectively etched by a dry etching, wet etching, or other removal technique.

After selective etching, a layer 452 is provided over gate stack 418. Preferably, layer 452 is a 15–20 nm silicon nitride (Si3N4) layer provided by plasma enhanced (PE) CVD. Layer 452 corresponds to spacers 426 (FIG. 19). Layer 452 prevents outgassing of germanium in conductor 422 through side walls 454. Alternatively, layer 452 can be another type of material suitable for preventing outgassing, such as, silicon dioxide or other insulator.

Figure 23:
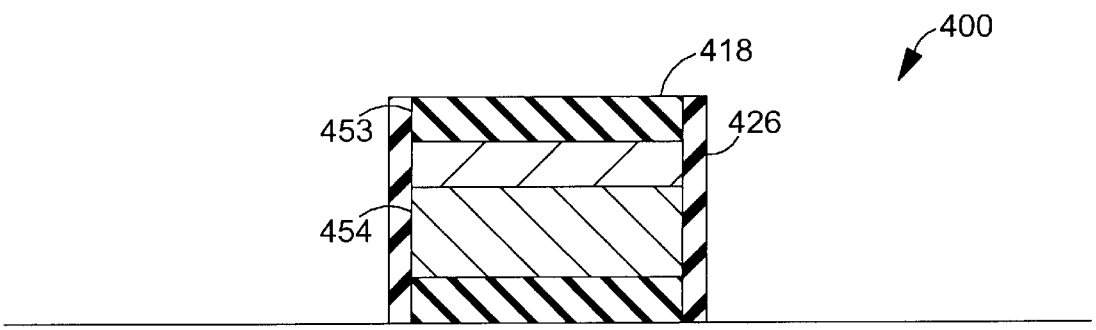
FIG. 23 is a cross-sectional view of the portion of the integrated circuit illustrated in FIG. 19, showing a selective etching step.

In FIG. 23, layer 452 is selectively etched to leave spacers 426 on side walls 454 of gate stack 418 (e.g., an etch back process). Spacers 454 are preferably 10–15 nm wide (from left to right) and 100–200 nm high (e.g. thick). Layer 452 is removed from layer 448 and from above the location of source 432 and drain 434 (FIG. 19).

After layer 452 is selectively removed, layer 418 can be removed. Preferably, layer 418 is removed in a wet chemical etching process. Layer 418 is removed so that electrical contact can be made to gate stack 418.

With reference to FIG. 19, after removal of layer 418 and top portions 453 of spacers 426, regions 432 and 434 as well as conductor 422 and layer 420 are heavily doped. Preferably, a dopant such as boron or boron difluoride (BF2) is utilized for an N-channel transistor, and a dopant such as phosphorous or arsenic is used for P-channel transistors.

Although transistor 412 has been described as an N-channel transistor, transistor 412 can alternatively be a P-channel transistor. Preferably, conductor 422, layer 420 and regions 432 and 434 are doped to have a concentration of $10^{19\text{-}21}$ dopants per centimeter square.

After doping, conventional semiconductor processes can be utilized to form additional spacers, contacts, interconnects and other structures necessary for the formation of an integrated circuit.

Although the fabrication of the thin film associated with conductor 422 has been described as part of a gate stack 418, the thin film can be utilized in a variety of semiconductor process applications. For example, the thin film can be utilized in any area where a semiconductor and germanium layer is necessary. In addition, the process can be utilized to make an amorphous semiconductor and germanium thin film.

It is understood that while the detailed drawings, specific examples, and particular values given provide a preferred exemplary embodiment of the present invention, the preferred exemplary embodiment is for the purpose of illustration only. The method and apparatus of the invention are not limited to the precise details and conditions disclosed. For example, although particular polysilicon/germanium gate structures are described, other types can be utilized. Various changes may be made to the details disclosed, without departing from the spirit of the invention, which is defined by the following claims.

What is claimed is:

1. A method of manufacturing an integrated circuit, comprising:

providing semiconductor and germanium thin film above a top surface of a substrate utilizing a semiconductor source and a germanium source;

reducing the germanium source while utilizing the semiconductor source to form a semiconductor buffer layer above the semiconductor and germanium thin film; and oxidizing at least a portion of the semiconductor buffer layer; and providing spacers on side walls of the thin film.

2. The method of claim 1 further comprising:

selectively etching the semiconductor buffer layer and the semiconductor and germanium thin film to form a gate stack before the providing the spacers step.

3. The method of claim 2 further comprising:

providing dopants to form source and drain regions in the substrate and wherein the thin film is less than 200 nm thick.

4. The method of claim 3, wherein the semiconductor source provides silicon.

5. The method of claim 4, wherein the semiconductor source is SiH4 and the germanium source is GeH4.

6. The method of claim 5, wherein the semiconductor and germanium thin film is provided by low pressure chemical vapor deposition.

7. The method of claim 6, wherein the providing step is performed at a temperature of less than 650 degrees C.

8. The method of claim 1, wherein the semiconductor buffer layer is less than 10 nanometers thick.

9. The method of claim 8, wherein the semiconductor buffer layer is oxidized to form an oxidized material more than 5 nm thick.

10. A method of manufacturing a silicon and germanium thin film comprising steps of:

depositing a germanium and silicon material on a top surface of a substrate utilizing a silicon gas source and a germanium gas source;

turning the germanium gas source off while leaving the silicon gas source on to form a silicon buffer layer over the germanium and silicon material; and oxidizing the silicon buffer layer to form an oxide layer above the silicon buffer layer.

11. The method of claim 10, wherein the silicon gas source is SiH4 and the germanium gas source is GeH4.

12. The method of claim 10, wherein the silicon germanium material is 100–200 nm thick and the silicon buffer layer is 5–20 nm thick.

13. The method of claim 10, wherein the depositing step is a low pressure chemical vapor deposition step at 600–650 degrees C.

14. The method of claim 10, further comprising:

selectively etching the oxide layer, silicon buffer layer, and silicon germanium material and providing silicon nitride spacers.

15. The method of claim 14 further comprising:

etching the oxide structure and doping the silicon and germanium material through the silicon buffer layer.

16. A method of providing a polysilicon and germanium thin film for an integrated circuit, the method comprising:

providing a silicon and germanium layer above a substrate;

providing a silicon buffer layer above the silicon and germanium layer; and oxidizing the silicon layer to form a silicon oxide layer above the silicon buffer layer.

17. The method of claim 16, further comprising selectively etching the silicon germanium layer, the silicon buffer layer, and the silicon oxide layer to form a gate stack having side walls.

18. The method of claim 17, further comprising providing a silicon nitride layer above the gate stack and the substrate.

19. The method of claim 18, further comprising etching the silicon nitride layer to leave thin spacers on the side walls.

20. The method of claim 17, further comprising removing the silicon oxide layer.

* * * * *